US010032695B2

(12) United States Patent
Iyengar et al.

(10) Patent No.: US 10,032,695 B2
(45) Date of Patent: Jul. 24, 2018

(54) POWERMAP OPTIMIZED THERMALLY AWARE 3D CHIP PACKAGE (71) Applicant: Google Inc., Mountain View, CA (US)

(72) Inventors: Madhu Krishnan Iyengar, Foster City, CA (US); Teck-Gyu Kang, Saratoga, CA (US); Christopher Gregory Malone, Mountain View, CA (US); Norman Paul Jouppi, Palo Alto, CA (US)

(73) Assignee: Google LLC, Mountain View, CA (US)

( * ) Notice: Subject to any disclaimer, the term of this patent is extended or adjusted under 35 U.S.C. 154(b) by 14 days.

(21) Appl. No.: 15/048,140

(22) Filed: Feb. 19, 2016

(65) Prior Publication Data
US 2017/0243806 A1    Aug. 24, 2017

(51) Int. Cl.
*H01L 23/473*    (2006.01)
*H01L 23/04*    (2006.01)
(Continued)

(52) U.S. Cl.
CPC ............ *H01L 23/473* (2013.01); *H01L 23/04* (2013.01); *H01L 23/3675* (2013.01);
(Continued)

(58) Field of Classification Search
CPC ... H01L 23/473; H01L 23/04; H01L 23/3675; H01L 23/3732; H01L 23/3736; H01L 23/3737; H01L 23/498; H01L 25/18
See application file for complete search history.

(56) References Cited

U.S. PATENT DOCUMENTS 9,158,344 B2    10/2015 Pyeon
9,220,183 B1    12/2015 Budiv et al.
(Continued)

FOREIGN PATENT DOCUMENTS

JP    S60134451 A    7/1985
JP    JH0311798 A    1/1991
(Continued)

OTHER PUBLICATIONS

European Extended Search Report for related EP Application No. 14156635.9 dated Jul. 10, 2017.
(Continued)

*Primary Examiner* — Fernando L Toledo
*Assistant Examiner* — Neil Prasad
(74) *Attorney, Agent, or Firm* — Honigman Miller Schwartz and Cohn LLP (57) ABSTRACT A semiconductor package includes a substrate, an integrated circuit disposed on the substrate, a memory support disposed on the integrated circuit, stacked memory disposed on the memory support and in communication with the integrated circuit, and a lid connected to the substrate. The integrated circuit has a low power region and a high power region. The memory support is disposed on the low power region of the integrated circuit and is configured to allow a flow of fluid therethrough to conduct heat away from the low power region of the integrated circuit. The lid defines a first port, a second port, and a lid volume fluidly connecting the first port and the second port. The lid volume is configured to house the integrated circuit, the memory support, and the stacked memory, while directing the flow of fluid to flow over the integrated circuit, the memory support, and the stacked memory.

21 Claims, 7 Drawing Sheets (51) Int. Cl.
*H01L 23/367* (2006.01)
*H01L 23/373* (2006.01)
*H01L 23/498* (2006.01)
*H01L 25/18* (2006.01)
*H01L 23/44* (2006.01)
*H01L 25/065* (2006.01)

(52) U.S. Cl.
CPC ...... *H01L 23/3732* (2013.01); *H01L 23/3736* (2013.01); *H01L 23/3737* (2013.01); *H01L 23/44* (2013.01); *H01L 23/498* (2013.01); *H01L 25/18* (2013.01); *H01L 25/0652* (2013.01)

(56) References Cited

U.S. PATENT DOCUMENTS

| | | | |
|---|---|---|---|
| 2010/0171213 A1 | 7/2010 | Hisano et al. | |
| 2012/0300402 A1* | 11/2012 | Vos | H01L 23/427 361/701 |
| 2013/0175493 A1* | 7/2013 | Song | H01L 45/06 257/3 |
| 2014/0048928 A1 | 2/2014 | Li et al. | |
| 2014/0055156 A1* | 2/2014 | Johnson | G01R 1/0433 324/754.15 |
| 2015/0029658 A1* | 1/2015 | Yairi | G06F 1/20 361/679.47 |
| 2015/0035134 A1* | 2/2015 | Hung | H01L 23/3675 257/712 |
| 2015/0279431 A1 | 10/2015 | Li et al. | |
| 2015/0348956 A1 | 12/2015 | Groothuis et al. | |
| 2016/0013173 A1 | 1/2016 | Vadhavkar et al. | |

FOREIGN PATENT DOCUMENTS

| | | |
|---|---|---|
| TW | 200933867 A | 8/2009 |
| TW | 201606886 A | 2/2016 |

OTHER PUBLICATIONS

Taiwanese Office Action for the related application No. 106104339 dated Nov. 23, 2017 with its English translation thereof.

\* cited by examiner

FIG. 5

POWERMAP OPTIMIZED THERMALLY AWARE 3D CHIP PACKAGE

TECHNICAL FIELD

This disclosure relates to powermap optimized thermally aware three dimensional (3D) chip packages.

BACKGROUND

Complementary metal-oxide semiconductor (CMOS) based microprocessors are one of the core technologies for technical infrastructure. Trends in performance scaling show that as CMOS microprocessor computing power increases over time, power demands increase, resulting in greater heat generation. In addition to industry standard chip packages or CMOS based microprocessors, the exploration of special purpose silicon (e.g. graphics processing unit (GPU) and custom application specific integrated circuit (ASIC)) increase, resulting in higher heat generation. As chip performance increases, the performance of high bandwidth memory also need to increase resulting in additional heat generation. Services, such as imaging and artificial intelligence, that may require large computer resources and a multitude of chip packages at high density (many servers in close proximity) further increase power problems.

SUMMARY

One aspect of the disclosure provides a semiconductor package. The semiconductor package includes a substrate, an integrated circuit disposed on the substrate, a memory support disposed on the low power region of the integrated circuit, stacked memory disposed on the memory support and in communication with the integrated circuit, and a lid connected to the substrate. The lid defines a first port, a second port, and a lid volume fluidly connecting the first port and the second port. The integrated circuit has a low power region and a high power region. The memory support is configured to allow a low of fluid therethrough to conduct heat away from the low power region of the integrated circuit. The lid volume is configured to house the integrated circuit, the memory support, and the stacked memory, while directing the flow of fluid to flow over the integrated circuit, the memory support, and the stacked memory.

Implementations of the disclosure may include one or more of the following optional features. In some implementations, the semiconductor package includes a heat sink disposed on the high power region of the integrated circuit. The lid volume may be configured to house the heat sink while directing the flow of fluid to flow over the heat sink. In this example, the heat sink has a plurality of fins. The semiconductor package may also include a heat conductive material disposed on the high power region of the integrated circuit. The lid volume is configured to house the heat conductive material while directing the flow of fluid to flow over the heat conductive material. The heat conductive material may include diamond and/or a composite of copper and carbon nanotubes or indium.

In some examples, the semiconductor package includes a heat sink disposed on a heat conductive material. The heat conductive material may be disposed on the high power region of the integrated circuit, and the lid volume is configured to house the heat sink while directing the flow of fluid to flow over the heat sink. In this example, the heat sink has a plurality of fins. The low power region and the high power region may not overlap. The memory support may include a porous material. The porous material may have regularly spaced pores. The semiconductor package may further include an interposer disposed on the integrated circuit. The memory support may be configured to electrically connect the memory and the integrated circuit.

Another aspect of the disclosure provides a method for operating a semiconductor package. The method includes receiving a flow of fluid and directing the flow of fluid over surfaces of a semiconductor package including stacked memory and an integrated circuit. The integrated circuit has a low power region and a high power region. The stacked memory is supported by a memory support on the low power region of the integrated circuit. The memory support directs the flow of fluid to conduct heat away from the low power region and the high power region of the integrated circuit.

This aspect may include one or more of the following optional features. The method may include directing the flow of fluid with a lid defining a first port, a second port, and a lid volume fluidly connecting the first port and the second port. The lid volume may be configured to house the integrated circuit, the memory support, and the stacked memory, while directing the flow of fluid to flow over the integrated circuit, the memory support, and the stacked memory. The method may further include a heat sink disposed on the high power region of the integrated circuit. The lid volume is configured to house the heat sink while directing the flow of fluid to flow over the heat sink. In this example, the heat sink has a plurality of fins. The method may further include a heat conductive material disposed on the high power region of the integrated circuit. The lid volume is configured to house the heat conductive material while directing the flow of fluid over the heat conductive material. The heat conductive material may include diamond and/or a composite of copper and carbon nanotubes, or indium.

In some examples, the method includes a heat sink disposed on a heat conductive material, which is disposed on the high power region of the integrated circuit. The lid volume is configured to house the heat sink while directing the flow of fluid to flow over the heat sink. In this example, the heat sink has a plurality of fins. The lower power region and the high power region may not overlap. The memory support may include a porous material, and the porous material may have regularly spaced pores. The method may further include an interposer disposed on the integrated circuit. The memory support may be configured to electrically connect the memory and the integrated circuit.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
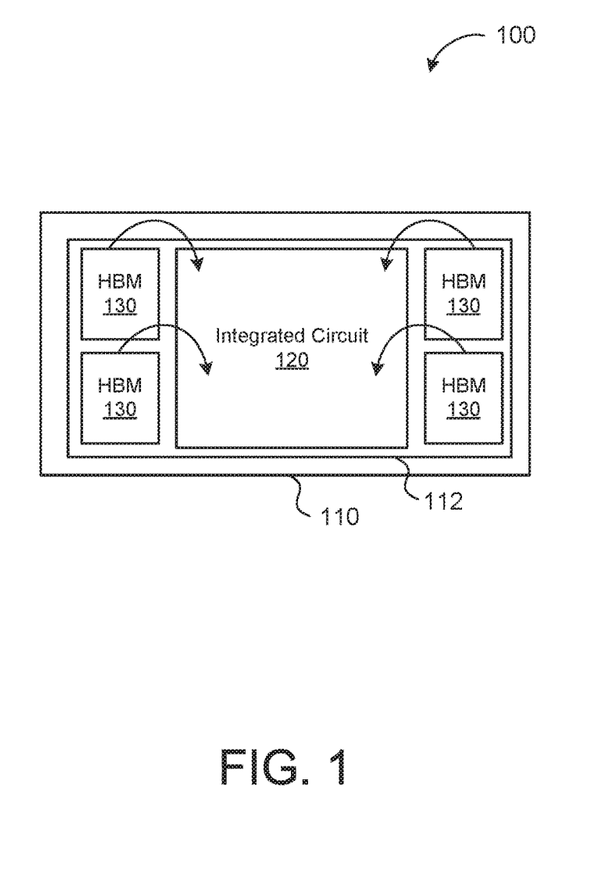
FIG. 1 is a schematic view of an example semiconductor package.

FIG. 1 shows a semiconductor package 100. The semiconductor package includes a substrate 110. The substrate 110 may be a nonconductive material or semi conductive material to allow mounting, routing, and pass through connections. In some implementations, the substrate 110 acts as a mounting surface and heat distribution surface. Common substrate 110 materials include, but are not limited to, fiberglass, FR4, polyimide, silicon, silicon dioxide, aluminum oxide, sapphire, germanium, gallium arsenide (GaAs), an alloy of silicon and germanium, or indium phosphide (InP). An interposer 112 is mounted on the substrate 110. An integrated circuit 120 and high bandwidth memory (HBM) 130 are mounted on the interposer 112. An interposer 112 provides electrical connections between one or more HBMs 130 and an integrated circuit 120. The interposer 112 also provides electrical interface routing between multiple connection points. In some implementations, the interposer 112 spreads connections to a wider pitch or route connections. An interposer 112 may also serve to provide an electrical path between outside of a semiconductor package and a termination pin for electrical and data communication. The HBM 130 may store information or digital data in an accessible form. The HBM 130 may be of a temporary type, such as random access memory, or of a longer storage type, such as long term memory or erasable programmable read-only memory (EPROM). The HBM 130 may include wider communication lanes and faster clock speeds for read and write access. The integrated circuit 120 may be a set of electronic circuits on one small plate of semiconductor material, commonly silicon. The integrated circuit 120 may be a general processing unit, a specific type of processing unit, such as a graphics processing unit, industry standard circuit, and/or an application specific integrated circuit. An application specific integrated circuit may be an integrated circuit (IC) customized for a particular use, rather than intended for general-purpose use. In order to perform a given function or computation, the integrated circuit 120 may need to communicate with the HBM 130 to store temporary data or data to be used later. The further the HBM 130 is located from the integrated circuit 120, the longer the communication time may be between the integrated circuit 120 and the HBM 130. The integrated circuit 120 may have to make multiple communications to the HBM 130 in order to access data. For example, the integrated circuit 120 may request a piece of data contained in the HBM 130, the HBM 130 may reply with the data to the integrated circuit 120, the integrated circuit 120 may reply to the HBM 130 with a checksum, and the HBM 130 may reply in acknowledgement to the integrated circuit 120 when the checksum was correct. Each time there is a communication the time it takes the data or electricity to travel the distance between the HBM 130 and the integrated circuit 120 adds delay and slows down the maximum operational speed of both the integrated circuit 120 and the HBM 130. Placing the HBM 130 closer to the integrated circuit 120 reduces the time the data needs to travel to the HBM 130 or the integrated circuit 120.

Figure 2A:
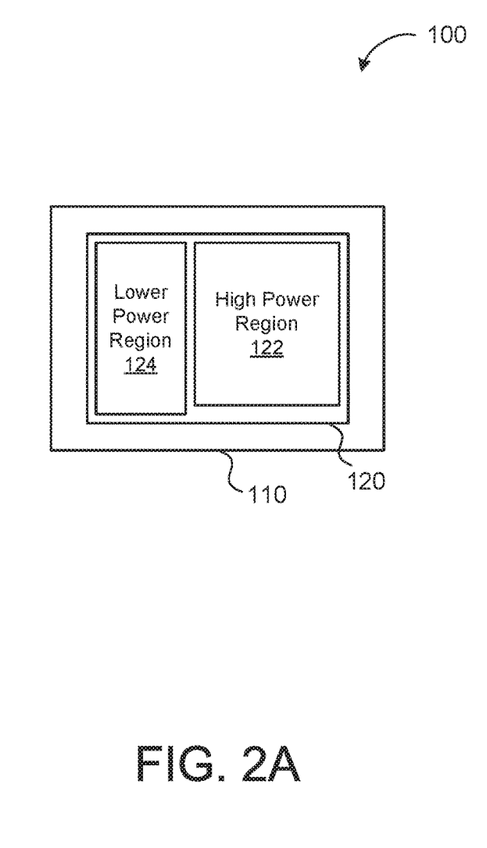
FIG. 2A is a top schematic view of an example integrated circuit with power regions mounted to a substrate.

FIG. 2A shows a top schematic view of an integrated circuit 120 with power regions mounted to a substrate 110. As an integrated circuit 120 operates or performs, computations heat may be generated. The placement of the number and type of semiconductors on the integrated circuit 120 may determine the amount of heat generated. High power semiconductors or logic semiconductors placed in close proximity to each other generate more heat than sparsely placed power semiconductors or logic semiconductors. The integrated circuit 120 includes a high power region 122 and a low power region 124. The high power region 122 may be an area with greater heat and the low power region 124 may be an area with lower heat (relative to the high power region 122) on the integrated circuit 120. The low power regions 124 and high power region 122 may be determined through simulation or actual experimentation.

Figure 2B:
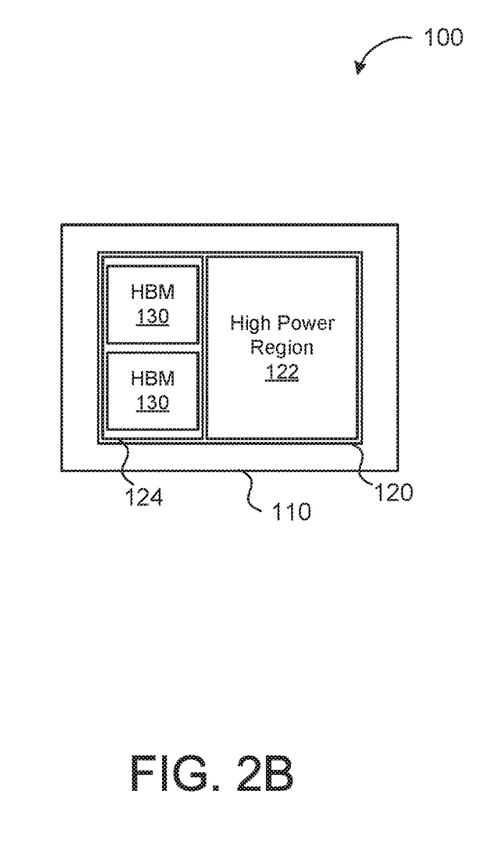
FIG. 2B is a top schematic view of one or more high bandwidth memory (HBM) components stacked on an integrated circuit.

FIG. 2B shows a top schematic view of one or more HBMs 130 stacked on the integrated circuit 120. By placing the HBMs 130 on the integrated circuit 120, the connection length may be shorter than when placed next to the integrated circuit 120. The HBMs 130 may be multiple HBMs 130 stacked on top of each other. The HBMs 130 are placed on top of the low power region 124 of the integrated circuit 120 to prevent excessive heat buildup, allow for an even distribution of cooling, shorten communication time, and shorten electrical connections.

Figure 3A:
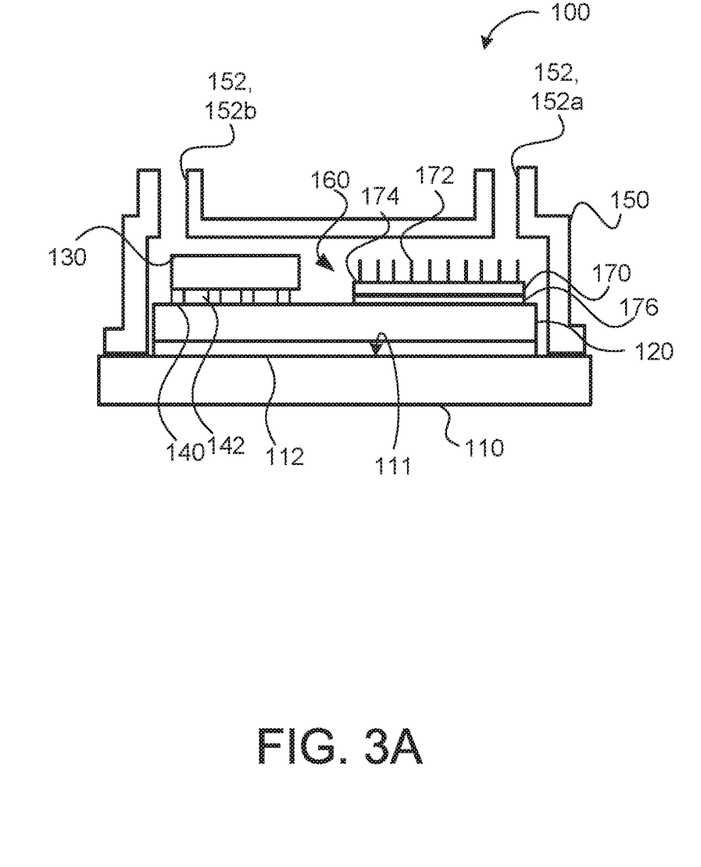
FIG. 3A is a side schematic view of an exemplary arrangement of a substrate, an integrated circuit, a HBM, and a lid.

FIG. 3A shows a side schematic view of the substrate 110, the integrated circuit 120, the HBM 130, and a lid 150. The interposer 112 connects to the top 111 of the substrate 110. The integrated circuit 120 connects to the interposer 112 and provides electrical connections between the substrate 110 and interposer 112. A HBM support 140 connects to the integrated circuit 120 on the low power region 124. The HBM 130 connects to the HBM support 140. The HBM support 140 provides electrical connections between the integrated circuit 120 and HBM 130 allowing for communication, power, and data to be passed through the HBM support 140. The HBM support 140 may be a porous material including HBM support pores 142. The HBM support pores 142 are voids of material that allow for cooling fluid to pass through the HBM support 140 and add additional cooling. The HBM support pores 142 may be of any shape sufficient to allowing cooling fluid 250 to pass through the HBM support pores 142. The HBM support pores 142 may be of a regular or irregular shape as long as sufficient connections between the HBM 130 and integrated circuit 120 can be made and cooling fluid 250 may flow through the HBM support 140. In some examples, the HBM support 140 is diamond, silicon and/or copper. The HBM support 140 may also be a composite diamond, silicon and/or composite copper with carbon nanotubes and/or indium.

A heat sink 170 connects to the high power region 122 of the integrated circuit 120. The heat sink 170 may include a base 174 to increase the heat absorbed from the integrated circuit 120. The heat sink 170 may also include one or more fins 172 to increase the surface area of the heat sink and/or increase the heat dissipations capability of the heat sink 170. The fins 172 may be any shape suitable for conducting heat away from the base 174 or the integrated circuit 120, including but not limited to, round, pin, planer, and/or tapered, etc. The heat sink 170 may be manufactured out of any suitable material for conducting heat, including, but not limited to, aluminum, coppery, and/or alloys, etc. A heat conductive material 176 may be placed between the heat sink 170 and the integrated circuit 120 to facilitate heat transfer. In some examples, the heat conductive material 176 is diamond and/or copper. The heat conductive material 176 may also be a composite diamond and/or composite copper with carbon nanotubes and/or indium.

The lid 150 connects to the substrate 110 and defines a lid volume 160 that houses the interposer 112, the integrated circuit 120, the HBM support 140, the HBM 130, heat sink 170, the fins 172, the base 174, and the heat conductive material 176. The lid 150 defines one or more ports 152 including a first port 152*a* and a second port 152*b*. The ports 152 may be a plurality of ports 152, and there is no limit to the number of ports 152 that may be used.

Figure 3B:
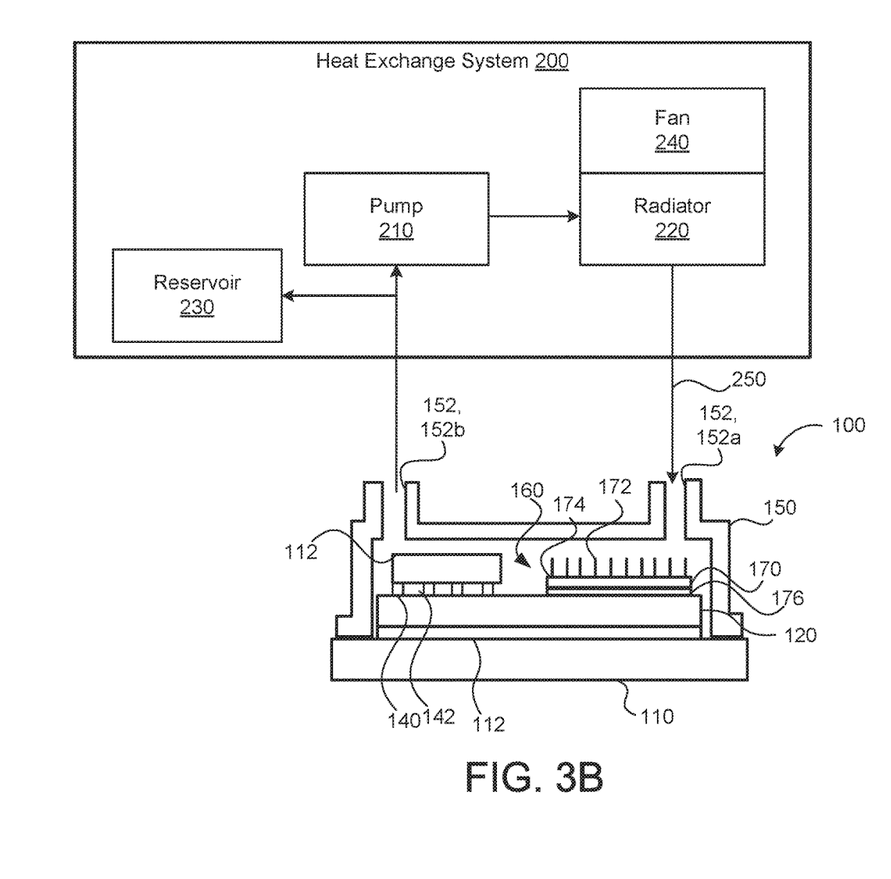
FIG. 3B shows a schematic view of an example semiconductor package and a heat exchange system.

FIG. 3B shows a schematic view including a semiconductor package 100 and a heat exchange system 200. The heat exchange system 200 includes a pump 210 connected to a radiator 220 and one of the ports 152, 152*b* of the lid 150. The radiator 220 is connected to one of the ports 152, 152*a* and the pump 210. The radiator 220 may be any device capable of exchanging heat, including, but not limited to, tubes, peltier cooling, fin systems, and/or thermal blocks, etc. In some implementations, the radiator 220 includes a fan 240 to increase the heat dissipation of the radiator 220 to the environment. In additional implementations, the heat exchange system 200 includes a reservoir 230 to store the fluid 250, as needed. The reservoir 230 may also be used to dissipate heat from the heat exchange system 200. As an example, the pump 210 draws hot fluid 250 from the second port 152*b* and directs it to the radiator 220. The radiator 220 cools the fluid 250 and the pump 210 directs the fluid 250 to the first port 152*a*. The cooled fluid enters the first port 152*a* and flows through the lid volume 160 absorbing heat from the integrated circuit 120, the heat sink 170, the HBM 130, and the HBM support 140. The fluid 250 containing the absorbed heat exits the second port 152*b* and returns to the pump 210, completing the heat exchanger system 200.

The total power capacity of the semiconductor package 100 may be determined by simulation or experimentation. One method of determining the total power capacity may be to set the $Q_m$ HBM power of the HBM 130, the Qhigh power of the high power region 122 of the integrated circuit 120, and the Qlow power of the low power region 122 of the integrated circuit 120 to a low baseline value. The method also includes keeping the cooling upon the lid 150 fixed to determine or document the maximum junction temperature for the HBM 130, the high power region 122, and the low power region 124, and comparing the documented junction values to the specifications for the integrated circuit 120 and the HBM 130. Next, adjust the cooling of the lid 150 and determining or documenting the maximum junction temperature for the HBM 130, the high power region 122, and the low power region 124. The method also includes comparing the documented junction values to the specifications and previous tests for the integrated circuit 120 and the HBM 130. The method further includes adjusting the location and size of the high power region 122 and the low power region 124 and while keeping the cooling on the lid 150 fixed and determining or documenting the maximum junction temperature for the HBM 130, the high power region 122, and the low power region 124. The method further includes comparing the documented junction values to the specifications and previous tests for the integrated circuit 120 and the HBM 130 and continuing adjustment until the junction temperature is minimized or maximum cooling has been achieved.

Figure 4:
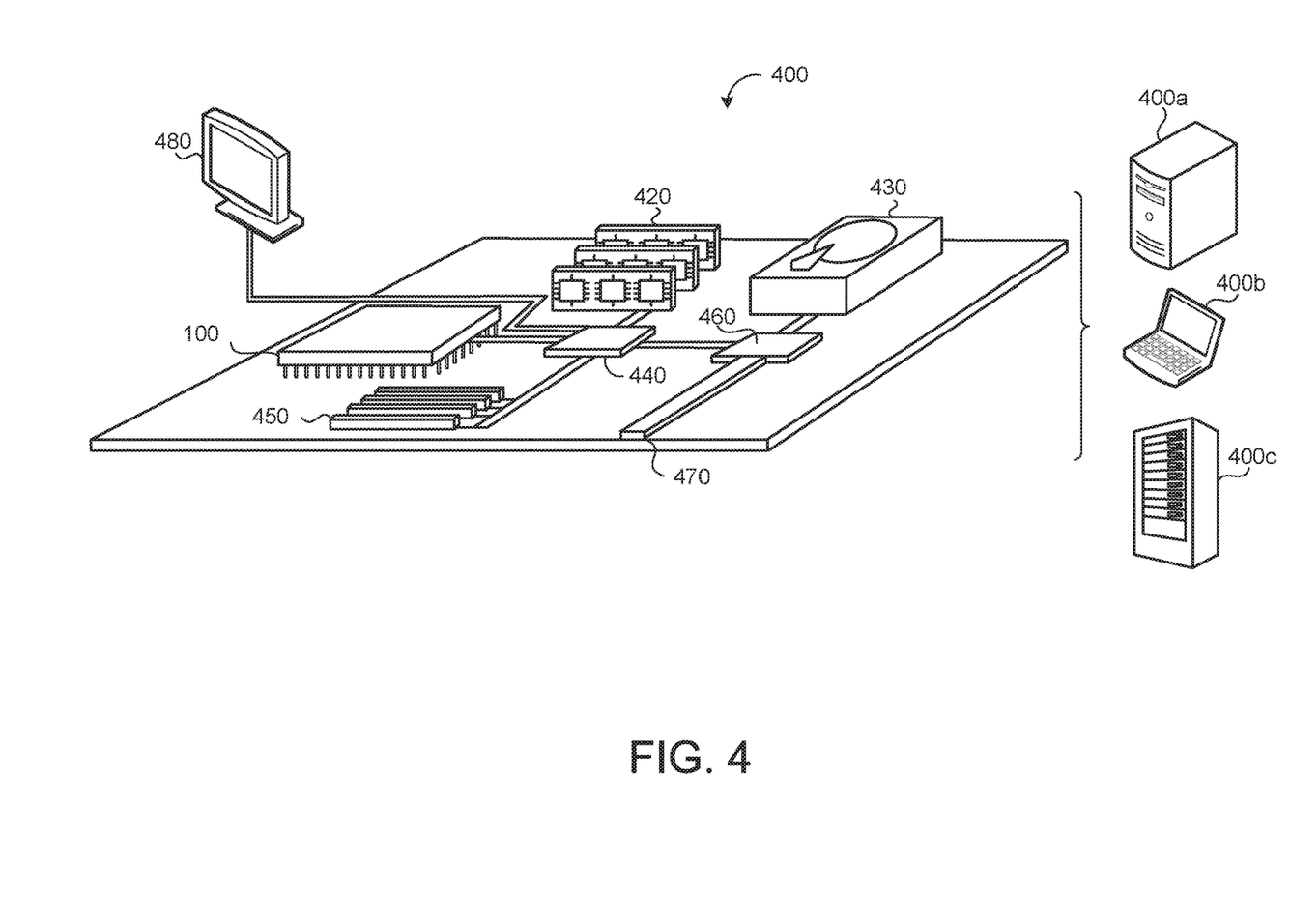
FIG. 4 is a schematic view of an example computing device.

FIG. 4 is a schematic view of an example computing device 400 that may be used to implement the device and methods described in this document. The computing device 400 is intended to represent various forms of digital computers, such as laptops, desktops, workstations, personal digital assistants, servers, blade servers, mainframes, and other appropriate computers. The components shown here, their connections and relationships, and their functions, are meant to be exemplary only, and are not meant to limit implementations of the disclosure described and/or claimed in this document.

The computing device 400 includes a semiconductor package 100, or processor, memory 420, a storage device 430, a high-speed interface/controller 440 connecting to the memory 420 and high-speed expansion ports 450, and a low speed interface/controller 460 connecting to low speed bus 470 and storage device 430. Each of the components 100, 420, 430, 440, 450, and 460, are interconnected using various busses, and may be mounted on a common motherboard or in other manners as appropriate. The semiconductor package 100, or processor can process instructions for execution within the computing device 400, including instructions stored in the memory 420 or on the storage device 430 to display graphical information for a graphical user interface (GUI) on an external input/output device, such as display 480 coupled to high speed interface 440. In other implementations, multiple processors and/or multiple buses may be used, as appropriate, along with multiple memories and types of memory. Also, multiple computing devices 400 may be connected, with each device providing portions of the necessary operations (e.g., as a server bank, a group of blade servers, or a multi-processor system).

The memory 420 stores information non-transitorily within the computing device 400. The memory 420 may be a computer-readable medium, a volatile memory unit(s), or non-volatile memory unit(s). The non-transitory memory 420 may be physical devices used to store programs (e.g., sequences of instructions) or data (e.g., program state information) on a temporary or permanent basis for use by the computing device 400. Examples of non-volatile memory include, but are not limited to, flash memory and read-only memory (ROM)/programmable read-only memory (PROM)/erasable programmable read-only memory (EPROM)/electronically erasable programmable read-only memory (EEPROM) (e.g., typically used for firmware, such as boot programs). Examples of volatile memory include, but are not limited to, random access memory (RAM), dynamic random access memory (DRAM), static random access memory (SRAM), phase change memory (PCM) as well as disks or tapes.

The storage device 430 is capable of providing mass storage for the computing device 400. In some implementations, the storage device 430 is a computer-readable medium. In various different implementations, the storage device 430 may be a floppy disk device, a hard disk device, an optical disk device, or a tape device, a flash memory or other similar solid state memory device, or an array of devices, including devices in a storage area network or other configurations. In additional implementations, a computer program product is tangibly embodied in an information carrier. The computer program product contains instructions that, when executed, perform one or more methods, such as those described above. The information carrier is a computer- or machine-readable medium, such as the memory 420, the storage device 430, or memory on semiconductor package 100, or processor.

The high speed controller 440 manages bandwidth-intensive operations for the computing device 400, while the low speed controller 460 manages lower bandwidth-intensive operations. Such allocation of duties is exemplary only. In some implementations, the high-speed controller 440 is coupled to the memory 420, the display 480 (e.g., through a graphics processor or accelerator), and to the high-speed expansion ports 450, which may accept various expansion cards (not shown). In some implementations, the low-speed controller 460 is coupled to the storage device 430 and low-speed expansion port 470. The low-speed expansion port 470, which may include various communication ports (e.g., USB, Bluetooth, Ethernet, wireless Ethernet), may be coupled to one or more input/output devices, such as a keyboard, a pointing device, a scanner, or a networking device, such as a switch or router, e.g., through a network adapter.

The computing device 400 may be implemented in a number of different forms, as shown in the figure. For example, it may be implemented as a standard server 400a or multiple times in a group of such servers 400a, as a laptop computer 400b, or as part of a rack server system 400c.

Figure 5:
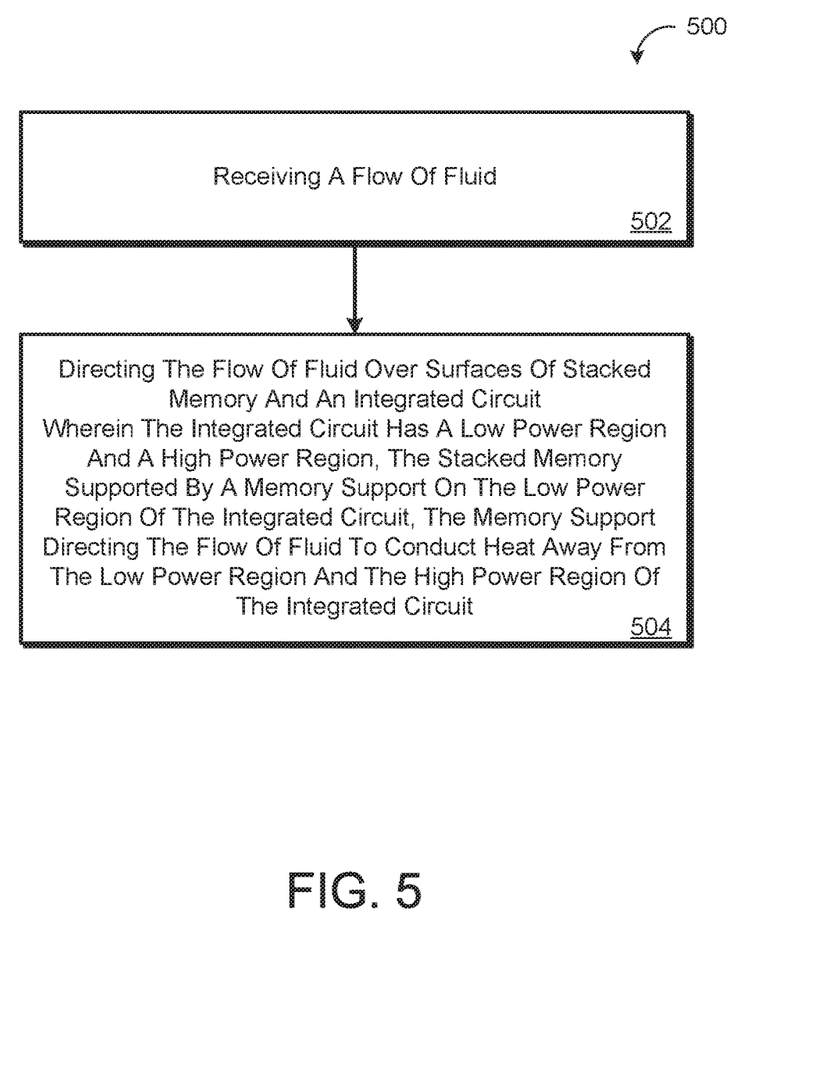
FIG. 5 shows a method for operating a semiconductor package.

FIG. 5 shows a method 500 for operating a semiconductor package 100. At block 502, the method 500 includes receiving a flow of fluid 250. The fluid 250 may be any fluid 250 suitable for absorbing and conducting heat. The fluid 250 may enter through a port 152, 152a in the lid 150 to the lid volume 160. At block 504, the method 500 includes directing the flow of fluid 250 over surfaces of stacked memory or high bandwidth memory 130 and an integrated circuit 120. The integrated circuit 120 has a low power region 124 and a high power region 122. The stacked memory or HBM 130 is supported by a memory support 140 on the low power region 124 of the integrated circuit 120. The memory support 140 directs the flow of fluid 250 to conduct heat away from the high power region 122 and the low power region 124 of the integrated circuit 120. The fluid 250 may be directed by the lid 150 into the lid volume 160 over the interposer 112, the integrated circuit 120, the HBM 130, the HBM support 140, and the heat sink 170. The fluid 250 absorbs heat generated from the interposer 112, the integrated circuit 120, the HBM 130, the HBM support 140, and the heat sink 170. The fluid may be directed to be dispelled by the heat exchange system 200.

The method 500 may include directing the flow of fluid 250 with a lid 150 defining a first port 152a, a second port 152b, and a lid volume 160 fluidly connecting the first port 152a and the second port 152b. The lid volume 160 may be configured to house the integrated circuit 120, the memory support 140, and the stacked memory 130, while directing the flow of fluid 250 to flow over the integrated circuit 120, the memory support 140, and the stacked memory 130. The method 500 may further include a heat sink 170 disposed on the high power region 122 of the integrated circuit 120. The lid volume 160 is configured to house the heat sink 170 while directing the flow of fluid 250 to flow over the heat sink 170. In this example, the heat sink 170 may have a plurality of fins 172. The method 500 may further include a heat conductive material 176 disposed on the high power region 122 of the integrated circuit 120. The lid volume 160 is configured to house the heat conductive material 176 while directing the flow of fluid 250 over the heat conductive material 176. The heat conductive material 176 may include diamond and/or a composite of copper and carbon nanotubes, or indium.

In some examples, the method 500 includes a heat sink 170 disposed on a heat conductive material 176, which is disposed on the high power region 122 of the integrated circuit 120. The lid volume 160 is configured to house the heat sink 170 while directing the flow of fluid 250 to flow over the heat sink 170 Moreover, the heat sink 170 may have a plurality of fins 172. The lower power region 124 and the high power region 122 may not overlap. The memory support 140 may include a porous material, and the porous material may have regularly spaced pores 142. The method 500 may further include an interposer 112 disposed on the integrated circuit 120. The memory support 140 may be configured to electrically connect the memory 130 and the integrated circuit 120.

While this specification contains many specifics, these should not be construed as limitations on the scope of the disclosure or of what may be claimed, but rather as descriptions of features specific to particular implementations of the disclosure. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multi-tasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

A number of implementations have been described. Nevertheless, it will be understood that various modifications may be made without departing from the spirit and scope of the disclosure. Accordingly, other implementations are within the scope of the following claims. For example, the actions recited in the claims can be performed in a different order and still achieve desirable results.

What is claimed is:
1. A semiconductor package comprising:
a substrate;
an integrated circuit disposed on the substrate, the integrated circuit having a low power region and a high power region;
a memory support connected to the integrated circuit on the low power region, the memory support configured to allow a flow of fluid therethrough to conduct heat away from the low power region of the integrated circuit;
stacked memory disposed on the memory support and in communication with the integrated circuit through the memory support, the memory support disposed between the stacked memory and the integrated circuit to support the stacked memory above the low power region of the integrated circuit and direct the flow of fluid between the stacked memory and the low power region of the integrated circuit; and
a lid connected to the substrate and defining a first port, a second port, and a lid volume fluidly connecting the first port and the second port, the lid volume configured to house the integrated circuit, the memory support, and the stacked memory, while directing the flow of fluid to flow over the integrated circuit, the memory support, and the stacked memory.

2. The semiconductor package of claim 1, further comprising a heat sink disposed on the high power region of the integrated circuit, the lid volume configured to house the heat sink while directing the flow of fluid to flow over the heat sink, the heat sink having a plurality of fins.

3. The semiconductor package of claim 1, further comprising a heat conductive material disposed on the high power region of the integrated circuit, the lid volume configured to house the heat conductive material while directing the flow of fluid to flow over the heat conductive material.

4. The semiconductor package of claim 3, wherein the heat conductive material comprises diamond and/or a composite of Copper and:
   Carbon nanotubes; or
   Indium.

5. The semiconductor package of claim 1, further comprising a heat sink disposed on a heat conductive material, the heat conductive material disposed on the high power region of the integrated circuit, the lid volume configured to house the heat sink while directing the flow of fluid to flow over the heat sink, the heat sink having a plurality of fins.

6. The semiconductor package of claim 1, wherein the low power region and the high power region do not overlap.

7. The semiconductor package of claim 1, wherein the memory support comprises a porous material.

8. The semiconductor package of claim 7, wherein the porous material defines regularly spaced pores.

9. The semiconductor package of claim 1, further comprising an interposer disposed on the integrated circuit.

10. The semiconductor package of claim 1, wherein the memory support is configured to electrically connect the memory and the integrated circuit.

11. A method comprising:
   receiving a flow of fluid; and
   directing the flow of fluid over surfaces of a semiconductor package comprising stacked memory and an integrated circuit, the integrated circuit having a low power region and a high power region,
   wherein the stacked memory is supported by a memory support connected to the integrated circuit on the low power region, the memory support disposed between the stacked memory and the integrated circuit to support the stacked memory above the low power region and direct the flow of fluid between the stacked memory and the low power region to conduct heat away from the low power region and the high power region of the integrated circuit.

12. The method of claim 11, further comprising directing the flow of fluid with a lid defining a first port, a second port, and a lid volume fluidly connecting the first port and the second port, the lid volume configured to house the integrated circuit, the memory support, and the stacked memory, while directing the flow of fluid to flow over the integrated circuit, the memory support, and the stacked memory.

13. The method of claim 12, wherein the semiconductor package further comprises a heat sink disposed on the high power region of the integrated circuit, the lid volume configured to house the heat sink while directing the flow of fluid to flow over the heat sink, the heat sink having a plurality of fins.

14. The method of claim 12, wherein the semiconductor package further comprises a heat conductive material disposed on the high power region of the integrated circuit, the lid volume configured to house the heat conductive material while directing the flow of fluid to flow over the heat conductive material.

15. The method of claim 14, wherein the heat conductive material comprises diamond and/or a composite of Copper and:
   Carbon nanotubes; or
   Indium.

16. The method of claim 12, wherein the semiconductor package further comprises a heat sink disposed on a heat conductive material, the heat conductive material disposed on the high power region of the integrated circuit, the lid volume configured to house the heat sink while directing the flow of fluid to flow over the heat sink, the heat sink having a plurality of fins.

17. The method of claim 11, wherein the low power region and the high power region do not overlap.

18. The method of claim 11, wherein the memory support comprises a porous material.

19. The method of claim 18, wherein the porous material defines regularly spaced pores.

20. The method of claim 11, wherein the semiconductor package further comprises an interposer disposed on the integrated circuit.

21. The method of claim 11, wherein the memory support is configured to electrically connect the memory and the integrated circuit.

* * * * *